United States Patent
Vellore et al.

(10) Patent No.: US 12,230,521 B2
(45) Date of Patent: Feb. 18, 2025

(54) METHOD FOR NON-CONTACT LOW SUBSTRATE TEMPERATURE MEASUREMENT

(71) Applicant: Applied Materials, Inc., Santa Clara, CA (US)

(72) Inventors: Kim Ramkumar Vellore, San Jose, CA (US); Leonid M. Tertitski, Vista, CA (US); Matthew D. Scotney-Castle, Morgan Hill, CA (US)

(73) Assignee: Applied Materials, Inc., Santa Clara, CA (US)

( * ) Notice: Subject to any disclaimer, the term of this patent is extended or adjusted under 35 U.S.C. 154(b) by 429 days.

(21) Appl. No.: 16/885,909

(22) Filed: May 28, 2020

(65) Prior Publication Data
US 2020/0381278 A1   Dec. 3, 2020

Related U.S. Application Data

(60) Provisional application No. 62/856,496, filed on Jun. 3, 2019.

(51) Int. Cl.
| | | |
|---|---|---|
| H01L 21/67 | (2006.01) | |
| G01J 5/00 | (2022.01) | |
| G01J 5/48 | (2022.01) | |
| H04N 5/33 | (2023.01) | |

(52) U.S. Cl.
CPC .......... H01L 21/67248 (2013.01); G01J 5/00 (2013.01); H04N 5/33 (2013.01); *G01J 2005/0077* (2013.01); *G01J 5/485* (2022.01)

(58) Field of Classification Search
CPC ........................... H04L 21/00; H04L 21/67248
See application file for complete search history.

(56) References Cited

U.S. PATENT DOCUMENTS

| | | |
|---|---|---|
| 5,200,023 A | 4/1993 | Gifford et al. |
| 7,414,224 B2 | 8/2008 | Aderhold et al. |
| 8,658,945 B2 | 2/2014 | Aderhold et al. |
| 9,431,278 B2 | 8/2016 | Aderhold et al. |

(Continued)

FOREIGN PATENT DOCUMENTS

| | | |
|---|---|---|
| CN | 1378260 A | 11/2002 |
| CN | 101111749 A | 1/2008 |

(Continued)

OTHER PUBLICATIONS

"Lecture 10 (CHE 323) Thermal Oxidation, part 1." https://www.youtube.com/watch?v=gOdVI8wuWUs. Published on Sep. 7, 2013 by Chris Mack.*

(Continued)

*Primary Examiner* — Kyle M Lotfi
(74) *Attorney, Agent, or Firm* — Patterson + Sheridan, LLP

(57) ABSTRACT

A method and apparatus for measuring a temperature of a substrate located in a semiconductor processing environment is disclosed. The substrate has a top surface and an edge surface, and is positioned in a prescribed location within the semiconductor processing environment. An infrared camera oriented to view one side of the edge surface of the substrate is triggered to obtain an infrared image of the one side of the edge surface of the substrate. The infrared image is processed to obtain a temperature profile of the substrate.

20 Claims, 11 Drawing Sheets

(56) References Cited

U.S. PATENT DOCUMENTS

| | | |
|---|---|---|
| 9,666,408 B2 | 5/2017 | Nakagawa et al. |
| 9,959,610 B2 | 5/2018 | Tertitski et al. |
| 2002/0141477 A1 | 10/2002 | Akahori et al. |
| 2003/0155072 A1 | 8/2003 | Lee et al. |
| 2005/0191044 A1 | 9/2005 | Aderhold et al. |
| 2007/0056940 A1 | 3/2007 | Salem et al. |
| 2007/0104470 A1 | 5/2007 | Aderhold et al. |
| 2009/0041443 A1 | 2/2009 | Aderhold et al. |
| 2011/0006527 A1 | 1/2011 | Kinzie et al. |
| 2015/0131698 A1 | 5/2015 | Vellore et al. |
| 2015/0340198 A1 | 11/2015 | Nakagawa et al. |
| 2017/0028560 A1* | 2/2017 | Senn .................... H01L 21/682 |
| 2018/0080831 A1* | 3/2018 | Nakamura ............ G01J 5/0856 |
| 2019/0076986 A1 | 3/2019 | Shigematsu |

FOREIGN PATENT DOCUMENTS

| | | | |
|---|---|---|---|
| CN | 101542254 A | | 9/2009 |
| JP | H09-126889 A | | 5/1997 |
| JP | 2001-284261 A | | 10/2001 |
| JP | 2002-294461 A | | 10/2002 |
| JP | 2003031634 A | * | 1/2003 |
| JP | 2005-011852 A | | 1/2005 |
| JP | 2007526637 A | | 9/2007 |
| JP | 2008060288 A | | 3/2008 |
| JP | 2014-036070 A | | 2/2014 |
| JP | 2014-139980 A | | 7/2014 |
| JP | 2016-001642 A | | 1/2016 |
| JP | 2016-223811 A | | 12/2016 |
| JP | 2018-166242 A | | 10/2018 |
| KR | 10-2009-0015335 A | | 2/2009 |
| KR | 10-2013-0027076 A | | 3/2013 |
| KR | 10-1931969 | | 12/2018 |
| WO | 2005093353 A1 | | 10/2005 |
| WO | 2014112628 A1 | | 7/2014 |

OTHER PUBLICATIONS

SICE-ICASE International Joint Conference 2006 Oct. 18-21, 2006 inBexco, Busan, KoreaNon-contact Temperature Measurement of Semitransparent Sili.*

International Search Report and Written Opinion for International Application No. PCT/US2020/034852 dated Sep. 15, 2020.

Office Action for Japanese Application No. 2021-571871 (APPM/44016713JP) dated Apr. 4, 2023.

Chinese National Intellectual Property Administration First Office Action dated Jun. 25, 2023.

Office Action for Korean Application No. 10-2021-7043083 dated Aug. 30, 2023.

Office Action for Japanese Application No. 2021-571871 dated Dec. 19, 2023.

Office Action for Japanese Application No. 2021-571871 dated Apr. 4, 2023.

Office Action for Japanese Application No. 2021-571871 dated Sep. 10, 2024.

Office Action for Korean Application No. 10-2021-7043083 dated Sep. 23, 2024.

* cited by examiner

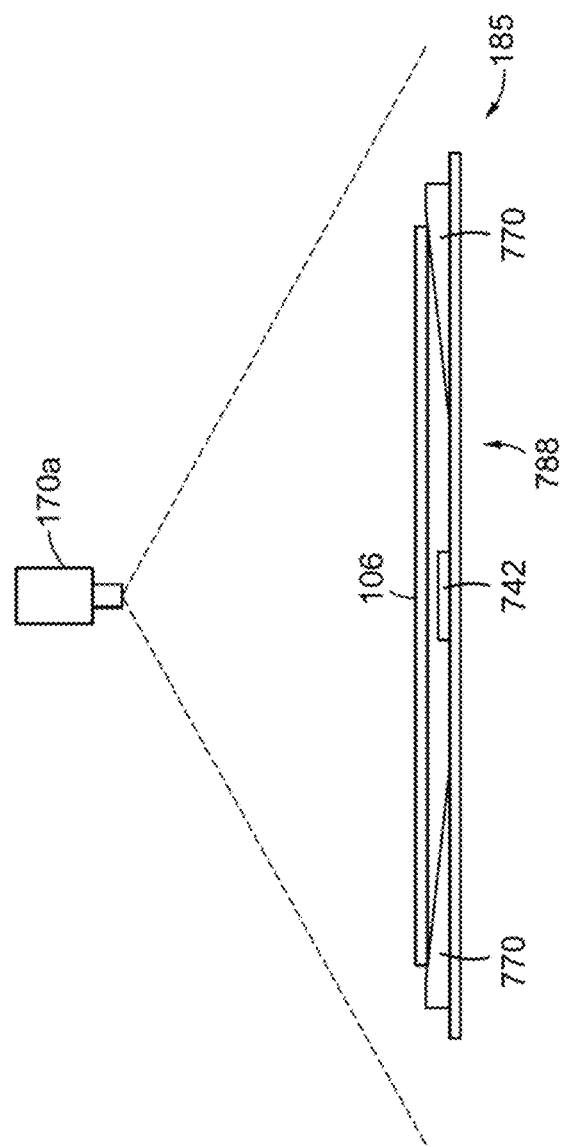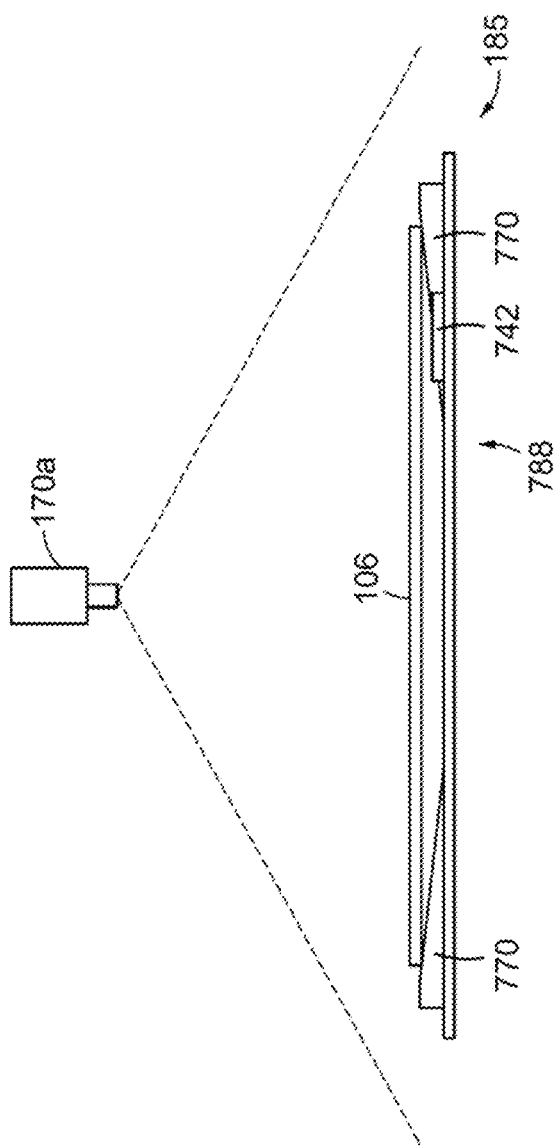

METHOD FOR NON-CONTACT LOW SUBSTRATE TEMPERATURE MEASUREMENT

CROSS-REFERENCE TO RELATED APPLICATIONS

This application claims priority to U.S. Provisional Application Ser. No. 62/856,496, filed on Jun. 3, 2019, which is herein incorporated by reference in its entirety.

BACKGROUND

Field

Embodiments of the present disclosure generally relate semiconductor device manufacturing, and more particularly, to apparatus and methods for measuring a temperature of a substrate with one or more infrared (IR) cameras.

Description of the Related Art

Ultra-large-scale integrated (ULSI) circuits may include more than one million electronic devices (e.g., transistors) that are formed on a semiconductor substrate, such as a silicon (Si) substrate, and cooperate to perform various functions within the devices. During processing, a number of thermal processing operations are occasionally performed on the substrate surface. Thermal processing typically utilizes precise substrate temperature measurement for process control. Inaccurate substrate temperature control may result in poor process results that may adversely influence device performance and/or result in substrate film material damage.

Different types of temperature measurement tools may be used to measure substrate temperature during thermal processing. For example, thermocouples are often used to measure a substrate temperature by physically contacting the substrate at predetermined locations on the substrate surface. However, with larger diameter substrates, the overall temperature variation across substrate surface is difficult to determine due to the large distances between measurement locations. Furthermore, the reliability of the thermal physical contact of the thermocouples to the substrate surface is hard to control and has contamination concerns.

Optical temperature measurement techniques can be used to monitor real-time temperature of the substrate during processing. One technique of monitoring temperature involves measuring the infrared (IR) energy emitted from the surface of a heated substrate, then converting this measured energy into a temperature reading.

A scanning monochromer and lock-in amplifier have been used to measure IR energy reflected from a substrate. The reflected IR energy varies in spectrum with the temperature of the substrate, thereby permitting the temperature of the substrate to be determined from this measurement. In order to permit the monochrometer to accurately scan over a range of reflected wavelengths, a series of filters are rotated within the monochrometer. This apparatus is bulky, expensive, and slow.

Further, the material used to form the substrates, e.g., crystalline silicon, may be transparent to IR wavelengths across a range of substrate temperatures where temperature measurements are desired. Thus, when a photodetector is located above the substrate to measure reflected IR energy, the IR energy directed towards the substrate travels therethrough instead of being reflected back toward the detector, adversely affecting the accuracy of the measurement. Infrared (IR) cameras have also been employed to measure temperatures of substrates where the IR camera is oriented to view the top or bottom of the substrate. Blank substrates are transparent to IR wavelengths at temperatures under 400° C. There are no known non-contact measurement techniques that can measure substrate temperatures under 400° C. on all types of substrates, particularly blank substrates.

Therefore, there is a need for an improved method and apparatus for low temperature measurement of substrates.

SUMMARY

In one embodiment, a method for measuring a temperature of a substrate located in a semiconductor processing environment is disclosed. The substrate has a top surface and an edge surface positioned in a prescribed location within the semiconductor processing environment. An infrared camera oriented to view one side of the edge surface of the substrate is triggered to obtain an infrared image of the one side of the edge surface of the substrate. The infrared image is processed to obtain a temperature profile of the substrate.

In one embodiment, a factory interface configured to measure a temperature of a substrate is disclosed. The factory interface includes a body. The factory interface further includes a robot disposed in the body and having an end effector for transferring the substrate between one or more load lock chambers and factory interface. The factory interface robot is configured to position the substrate in a prescribed location of the factory interface. An infrared camera is positioned in the factory interface and radially aligned with the prescribed location. The factory interface further includes a controller configured to trigger the infrared camera to view one side of an edge surface of the substrate to obtain a first infrared image of the substrate. The data from the first infrared image is processed to determine an absolute temperature profile of the substrate.

In one embodiment, a factory interface configured to measure a temperature of a substrate is disclosed. The factory interface includes a body. The factory interface further includes a robot disposed in the body having an end effector for transferring the substrate through the factory interface. The factory interface robot is configured to position the substrate in a prescribed location of the factory interface. The factory interface robot is further configured to position the substrate to place a top surface of the substrate in a field of view of an infrared camera positioned proximal to an edge of the substrate and radially aligned with the substrate. The factory interface robot is further configured to position a reflective blackbody element below a bottom surface of the substrate. The blackbody element is covered by the substrate. The factory interface further includes a controller configured to trigger the infrared camera to obtain an image of the top surface of the substrate including the blackbody element viewable by the infrared camera through the substrate. The controller is further configured to analyze the image to determine a temperature of the substrate based on an amount of infrared light reflected from the blackbody element and viewable through the substrate.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIGS. 7B and 7C illustrate the black body element coupled to a robot end effector.

Figure 1:
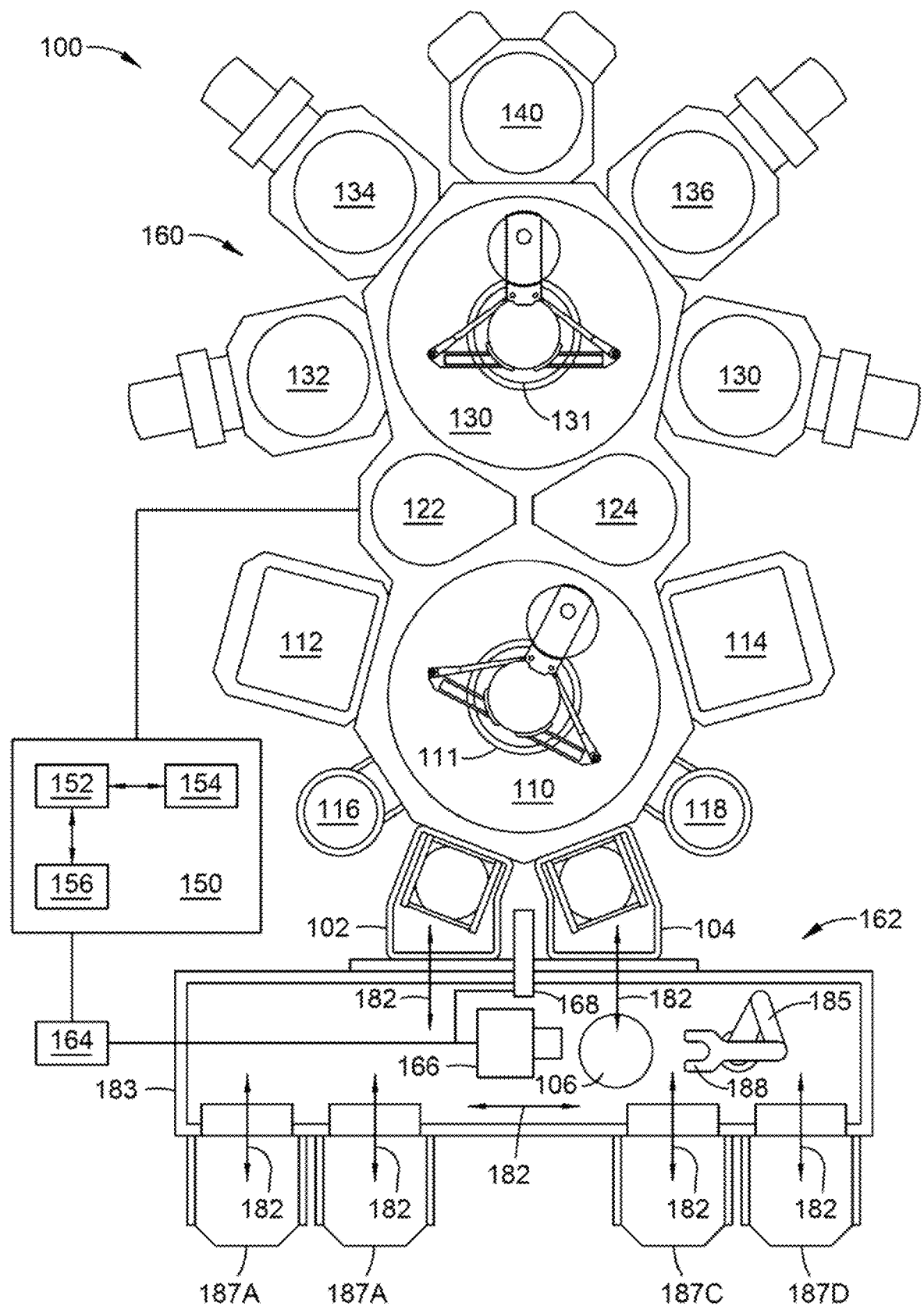
FIG. 1 illustrates an integrated platform configured to use one infrared camera for capturing an absolute temperature profile of an edge of the substrate.

To facilitate understanding, identical reference numerals have been used, where possible, to designate identical elements that are common to the figures. It is contemplated that elements disclosed in one embodiment may be beneficially utilized in other embodiments without specific recitation thereof with respect thereto.

DETAILED DESCRIPTION

Low temperature measurement of substrates below about 400° C. is problematic for existing infrared imaging techniques for imaging the top of a substrate. Under 400° C., the substrate appears to be transparent. Low temperature measurements are needed especially during an annealing process of manufacturing a semiconductor substrate. In the following disclosure, an improved technique for measuring low temperatures of a substrate using one or more infrared cameras that image edges of the substrate are described. Measuring the temperature of the edge of the substrate rather than the top surface of the substrate provides for a larger effective distance or thickness of the substrate that is being measured that is not transparent to the infrared cameras. Measuring the edge temperature of the substrate works for all types of substrates: bare, doped, or having circuitry manufactured thereon. Measuring low temperatures during an exit from an anneal process permits measurements below the oxidation temperature of the substrate.

FIG. 1 illustrates an integrated platform 100 configured to use one infrared camera for capturing the absolute temperature profile of the edge of the substrate 106, according to one or more embodiments. For example, the integrated platform 100 may deposit or etch one or more metal layers, semiconductor layers, and/or organic materials on the substrate 106 to fabricate a semiconductor device. Examples of an integrated platform including multiple processing chambers include those commercially available from Applied Materials, Inc. of Santa Clara, Calif. Alternatively, other substrate processing platforms may be also be modified in accordance with the present disclosure.

The integrated platform 100 may include a vacuum-tight processing platform 160, a factory interface 162, and a controller 150. Further, the integrated platform 100 may also be referred to as a cluster tool or multi-chamber processing system.

The processing platform 160 includes one or more process chambers. For example, the processing platform 160 may include process chambers 112, 114, 116, 118, 132, 134, 138, 136, and 140. Further, the processing platform 160 includes one or more transfer chambers. For example, as is illustrated in FIG. 1, the processing platform 160 includes transfer chambers 110 and 130. The processing platform 160 may also include one or more pass through chambers that allow a substrate 106 to be transferred between transfer chambers 110, 130. For example, the pass through chambers 122, 124 may allow a substrate 106 to be transferred between the transfer chambers 110 and 130.

The processing platform 160 may also include one or more load lock chambers. For example, as is illustrated in FIG. 1, the processing platform 160 includes load lock chambers 102, 104. The load lock chambers 102, 104 may be pumped down to be operated under a vacuum before transferring substrates 106 from the factory interface 162 and the transfer chamber 110.

The factory interface 162 includes a body 183, one or more factory interface robots 185, and interfaces for engaging one or more front opening unified pods (FOUPS) 187A-187D. The factory interface robot 185 is capable of linear and rotational movement, to facilitate transfer of a substrate 106 as illustrated by arrows 182. Further, the factory interface robot 185 transfers substrates 106 resting on an end effector 188 of the robot 185 between the FOUPS 187A-D, and the load lock chambers 102, 104. The substrate 106 may be transferred from the load lock chambers 102, 104 and transferred to one of the FOUPS 187A-D by the factory interface robot 185. As soon as a substrate 106 exits from one or both of the load lock chambers 102, 104, the factory interface robot 185 may be configured to place the substrate 106 on a substrate support (not shown) or retain the substrate 106 at one or more prescribed locations within the factory interface 162 (for example, on the end effector 188). At the prescribed location, imaging of the substrate 106 is performed according to one or more embodiments described herein. The substrate 106 is then transferred by the factory interface robot 185 from the substrate support/prescribed locations to the one or more of the load lock chambers 102, 104 or to the FOUPS 187 A-D.

The transfer chamber 110 includes a transfer robot 111. The transfer robot 111 transfers substrates 106 to and from the load lock chambers 102, 104, to and from the process chambers 112, 114, 116, and 118, and to and from pass through chambers 122, 124. The pass-through chambers 122 and 124 may be utilized to maintain vacuum conditions while allowing substrates 106 to be transferred within the integrated platform 100 between transfer chambers 110 and 130. The transfer robot 131 transfers substrates 106 between the pass-through chambers 122, 124 and the process chambers 132, 134, 136, 138, and 140, and between the process chambers 132, 134, 136, 138, and 140.

The process chambers 112, 114, 116, 118, 132, 134, 138, 136, and 140 are configured in any manner suitable to process a substrate 106. For example, the process chambers 112, 114, 116, 118, 132, 134, 138, 136, and 140 may be configured to deposit one or more metal layers, one or more semiconductor layers, one or more organic films, and apply one or more cleaning processes to a substrate 106 to create a semiconductor device such as a light sensing device, or the like. The process chambers 112, 114, 116, 118, 132, 134, 138, 136, and 140 may additionally or alternatively be configured for etching, annealing, curing, outgassing, metrology, or other operations.

A first one or more of the process chambers, e.g., the process chambers 116, 118, are configured to perform a pre-cleaning process to eliminate contaminants and/or de-gas volatile gases from a substrate 106 prior to transfer into another process chamber. The process chambers 114 and 112 may be configured to deposit one or more metal layers on a substrate 106. The process chamber 138 may be configured to deposit one or more layers of semiconductor materials on a substrate 106. The process chambers 116, 118, 132, 134, 138, 136, and 140 may be configured to deposit materials (e.g., metal layers or organic films) using a chemical deposition process such as chemical vapor deposition (CVD), atomic layer deposition (ALD), metalorganic chemical vapor deposition (MOCVD), plasma-enhanced chemical vapor deposition (PECVD), and physical vapor deposition (PVD), among others.

The controller 150 is configured to control the components of the integrated platform 100. The controller 150 may be any suitable controller for controlling the operation one or more of the process chambers, the transfer chambers, pass through chambers, and the factory interface. For example, the controller 150 may be configured to control the operation of transfer robot 111 and/or the transfer robot 131, and optionally the factory interface robot 185. The controller 150 includes a central processing unit (CPU) 152, a memory 154, and support circuits 156. The CPU 152 may be any general purpose computer processor that may be utilized in an industrial environment. The support circuits 156 are coupled to the CPU 152 and may include cache, clock circuits, input/output subsystems, power supplies and the like. Software routines may be stored within the memory 154. The software routines may be executed by the CPU 152. Alternatively, or additionally, one or more of the software routines may be executed by a second CPU not illustrated. The second CPU may be part of the controller 150 or remote from the controller 150.

One or more infrared (IR) cameras 166, one or more camera triggers 168, and/or the factory interface 162 may have a dedicated controller 164 or a controller integrated into or with the controller 150. The controller 164 is configured to control measuring a temperature of the substrate 106 located in a semiconductor processing environment (e.g., the integrated platform 100). In one embodiment, the controller 164 is configured to cause the factory interface robot 185 to remove the substrate 106 from one of the load lock chambers 102, 104 and place the substrate 106 on the substrate support 190 located in the factory interface 162. The factory interface robot 185 may move the substrate 106 held on the end effector 188 of the robot 185 to place the substrate 106 having a top surface and an edge surface in one or more prescribed locations within the semiconductor processing environment (e.g., placed on the substrate support 190 or the substrate 106 is held directly on the end effector 188 of the robot as the substrate 106 leaves and is proximal to one of the load lock chambers 102, 104).

The trigger(s) 168 is configured to trigger one or more infrared camera(s) 166 oriented to view one side of the edge surface of the substrate 106 along a radial axis of the substrate 106 to obtain an infrared image of the one side of the edge surface of the substrate 106. The one or more infrared cameras 166 may be positioned proximal to an edge of the substrate support 190 and radially aligned with the substrate support 190. The trigger(s) 168 may be a hardware trigger which may be, for example, a proximity sensor, or a software trigger. The trigger(s) 168 may be triggered in response to the substrate 106 being removed from one of the load lock chambers 102, 104 by the factory interface robot 185. The controller 164 is configured to process the infrared image to obtain an absolute or relative temperature profile of the substrate 106. When determining the (absolute) temperature profile of the substrate 106, the profile is independent of a type of the substrate (e.g., a bare substrate, a doped substrate, a substrate with semiconductor devices manufactured thereon, etc.). Because the infrared camera 166 captures a side (e.g., profile) image of the substrate 106, a detectable infrared image is obtained to be processed, even when the substrate 106 has a temperature of about 400° C. or below.

Figure 2:
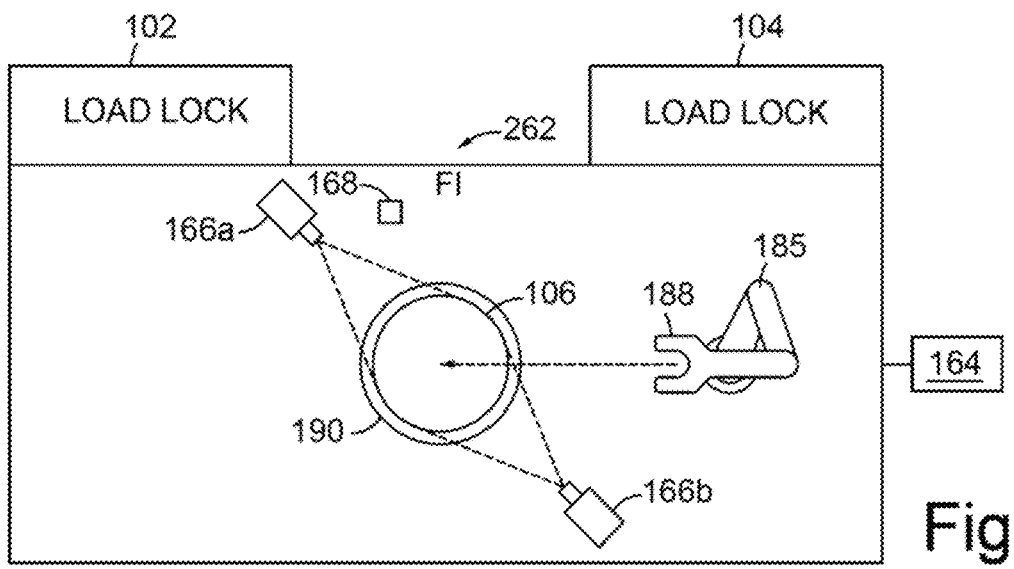
FIG. 2 illustrates a factory interface according to another embodiment.

FIG. 2 shows another embodiment of factory interface 262 with the load lock chambers 102, 104 shown for reference. The factory interface 262 is configured to use two infrared cameras 166 for capturing the absolute temperature profile of the edge of the substrate 106. The factory interface 262 may be utilized in integrated platform 100 of FIG. 1.

The factory interface 262 includes the controller 164 (or is coupled thereto), the infrared cameras 166*a*, 166*b*, the trigger(s) 168, and the factory interface robot 185. The factory interface robot 185 has an end effector 188 for retaining the substrate 106 or for positioning the substrate 106 on a substrate support 190 in a field of view of the infrared cameras 166*a*, 166*b*. The factory interface 162 holds one or more of the substrates 106 individually on the end effector 188, or at a substrate support 190 (such as a cool down station) of the factory interface 162. The substrates 106, having a top surface and an edge surface, is positioned by the factory interface robot 185 in a prescribed location (e.g., the substrate support 190). Upon a triggering event, the trigger(s) 168 is configured to trigger a first infrared camera 166*a* oriented to view one side of the edge surface of the substrate 106 along a radial axis of the substrate 106 to obtain a first infrared image of the one side of the edge surface of the substrate 106. The trigger(s) 168 is configured to trigger a second infrared camera 166*b* oriented to view a second side of the edge surface of the substrate 106 along the radial axis of the substrate 106 not included in the first infrared image (or only partially included in the first infrared image) to obtain a second infrared image of a second side of the edge surface of the substrate 106. The controller 164 is configured to process the data from the first infrared image and the second infrared image to obtain an absolute temperature profile of the substrate 106. When determining the (absolute) temperature profile of the substrate 106, the profile is independent of a type of the substrate 106 (e.g., a bare substrate, a doped substrate, a substrate with semiconductor devices manufactured thereon, etc.).

While FIG. 1 illustrates the substrate 106 positioned on the substrate support 190 during image capturing, it is contemplated that the substrate support 190 may be omitted. In such an example, the substrate 106 may remain on the end effector 188 during image capturing.

Figure 3:
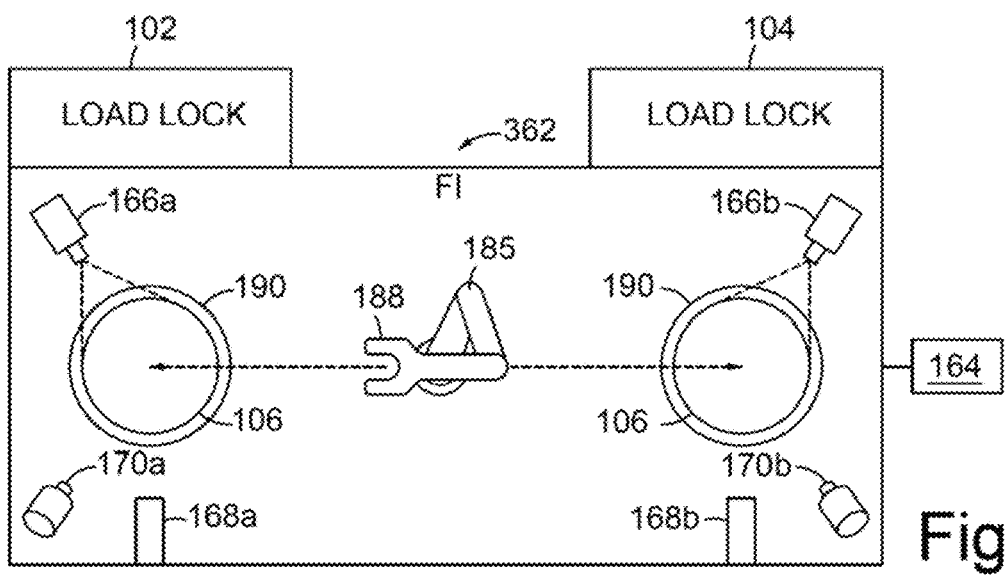
FIG. 3 illustrates a factory interface according to another embodiment.

FIG. 3 shows another embodiment of a factory interface 362 configured to use four infrared cameras 166a, 166b, 170a, 170d for capturing the absolute temperature profile of the edge and the top of substrates 106. The factory interface 362 may be used in the integrated platform 100, and shows the load lock chambers 102, 104 for reference.

The factory interface 362 is coupled to the controller 164, and includes the infrared cameras 166a, 166b, 170a, and 170b, one or more triggers 168a, 168b (two are shown), and the factory interface robot 185. The factory interface robot 185 has an end effector 188 for positioning substrates 106 on substrate supports 190 in a field of view of respective infrared cameras 166a, 170a or 166b, 170b. It is noted that the factory interface 362 includes two substrate supports 190, each with a respective trigger 168 and infrared cameras 166a, 166b (or 166c, 166d). However, it is contemplated that the factory interface 362 may include only a single substrate support 190 with a respective trigger 168 and cameras 166a, 170a. In an example where only a single substrate support 190 is included, the substrate support 190 may be centrally located within the factory interface. In another embodiment, instead of the substrate 106 being placed on the substrate support 190, the substrate 106 may be held directly on the end effector 188 of the robot.

The trigger 168a is configured to trigger a first infrared camera 166a oriented to view one side of the edge surface of a first substrate 106 along a radial axis of the substrate 106. The first infrared camera 166a obtains a first infrared image of one side of an edge surface of the first substrate 106. The trigger 168a is also configured to trigger a second infrared camera 170a (simultaneously or sequentially with the first infrared camera 166a). The camera 170a is oriented to view a top surface of the first substrate 106a perpendicular to the radial axis of the first substrate 106 to obtain a second infrared image of the top surface of the first substrate 106. For clarity, the infrared camera 170a is shown laterally offset from the substrate 106. However, it is to be understood that the infrared camera 170a may be positioned vertically above the substrate 106 without any lateral offset, in order to facilitate image capturing.

Similarly, a second substrate 106 is positioned on a second substrate support 190 on an opposite side of the factory interface 362. A third infrared camera 166b (similar to the first infrared camera 166a) and a fourth infrared camera 170b (similar to the second infrared camera 170a) capture respective top and side images of the second substrate 106b, in response to a signal from the trigger 168b.

While FIG. 3 illustrates the substrates 106 positioned on the substrate supports 190 during image capturing, it is contemplated that the substrate supports 190 may be omitted. In such an example, the substrate 106 may remain on the end effector 188 during image capturing.

As illustrated in FIG. 3, each load lock chamber 102, 104 is associated with a respective substrate support 190, trigger sensor 168a or 168b, and respective infrared cameras 166a, 170a or 166b, 170b, thus improving throughput.

Figure 4:
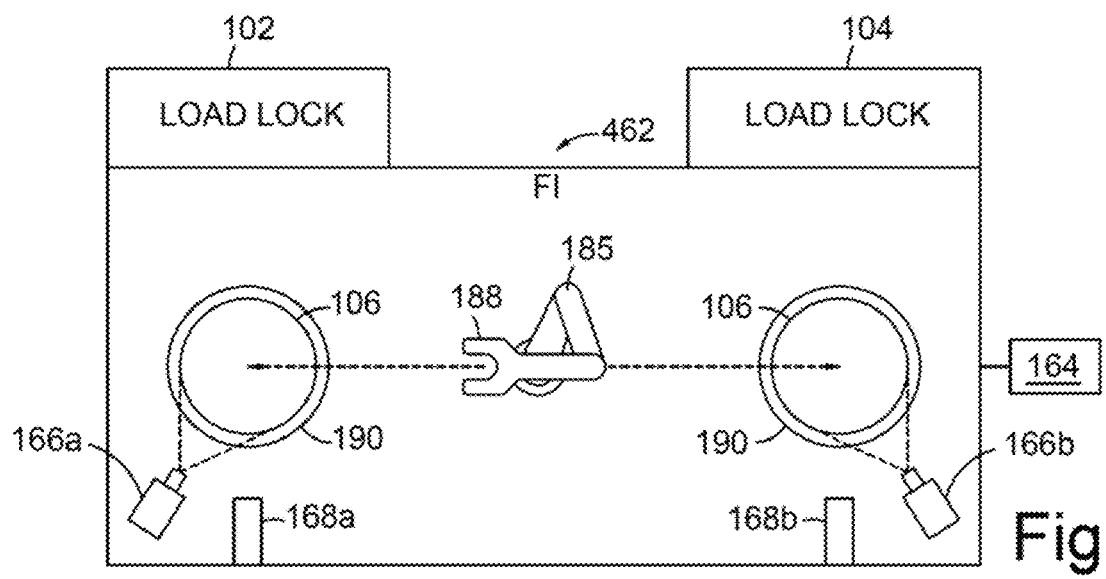
FIG. 4 illustrates a factory interface according to another embodiment.

FIG. 4 shows another embodiment of a factory interface 462. The factory interface 462 may be used in the integrated platform 100. The load lock chambers 102, 104 of FIG. 1 are shown for reference.

The factory interface 462 is similar to the factory interface 362, however, infrared cameras 170a, 170b are omitted. In such a configuration, capturing of a plan view image (e.g., a top-down image) is omitted, and temperature determination of a substrate 106 is based solely on a side (e.g., profile) capture image.

In an embodiment, the integrated platform 100 of FIG. 1 may be employed to use one infrared camera 166 for determining that a substrate 106 is tilted. The substrate is considered to be tilted when the top surface of the substrate 106 is not parallel to a reference plane within the system, such as a substrate support surface. In another example, the top surface of the substrate 106 may be non-parallel to a bottom surface of the substrate 106, due to uneven deposition (or other processing) on the top surface of the substrate 106. The tilting may occur as a result of uneven processing at several locations in the integrated platform 100, including, but not limited to, one or more of the process chambers 112, 114, 116, 118, 132, 134, 138, 136, and 140.

When determining whether a substrate is tilted, the substrate may be placed on a substrate support 190. In another embodiment, instead of the substrate 106 being placed on the substrate support 190, the substrate 106 may continue to be held directly on the end effector 188 of the robot as the substrate 106 leaves and is proximal to one of the load lock chambers 102, 104. In such an example, the trigger(s) 168a, 168b are configured to trigger respective infrared cameras 166a, 166b to obtain a first infrared image of a top surface of a substrate 106. The controller 164 is configured to process the first infrared image to obtain a first temperature profile. The controller 164 compares the first temperature profile to temperature profile stored in the memory 154 of a substrate known not to be tilted to identify that the substrate 106 is tilted based on one or more differences between the profiles. In an embodiment, the substrate 106 is identified as being tilted when the controller 164 detects a difference in edge temperature and a shift of a location of high temperature at a center of the top surface relative to a known, non-tilted substrate.

While not shown, it is contemplated that temperature determination of the substrate 106 may occur in addition to tilt determination. In such an example, one or more additional infrared cameras may be positioned in the factory interface 462 to capture a profile view of a substrate 106.

Figure 5B:
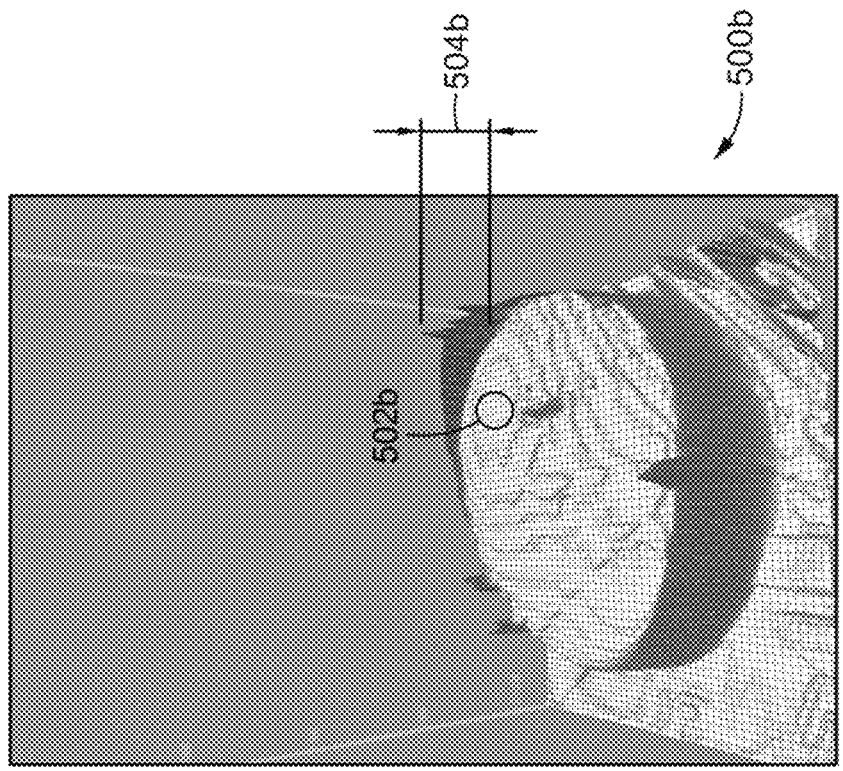
FIGS. 5A and 5B show an example of a first temperature profile and a second temperature profile for identifying that a substrate is tilted.
Figure 5A:
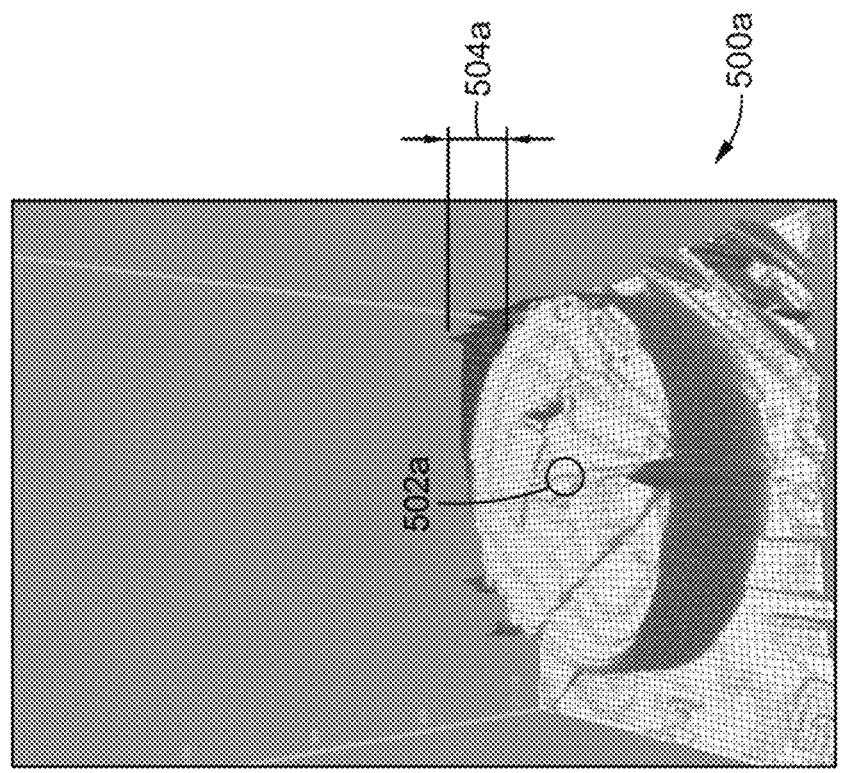

FIG. 5A shows an example of a stored temperature profile 500a and a second temperature profile 500b associated with the substrate 106 for identifying that the substrate 106 is tilted. The controller 164 (through execution of a software program thereon) identifies the location 502a of maximum temperature, of the substrate in the stored temperature profile 500a, corresponding to a non-tilted profile. In a non-tilted orientation, the center is generally hotter (a location 502a) than at other locations on the top surface of the substrate 106 known not to be tilted. The controller 164 identifies the temperature at the edge 504a of the substrate known not to be tilted.

Once an image of a substrate 106 is captured in a factory interface to generate a second temperature profile 500b, the controller 164 identifies the position of the hot spot 502b and the edge 504b of the substrate 106 in the second temperature profile 500b. The first temperature profile 500a is then compared to the second temperature profile 500b. Differences between the first temperature profile 500a and the second temperature profile 500b (or lack thereof) indicate whether the substrate in factory interface is tilted. The controller 164 determines that the substrate 106 is tilted by detecting a difference in edge temperature (between 504a, 504b) above a threshold and/or a shift from a location (502a) of maximum temperature to an off-center location.

Figure 6A:
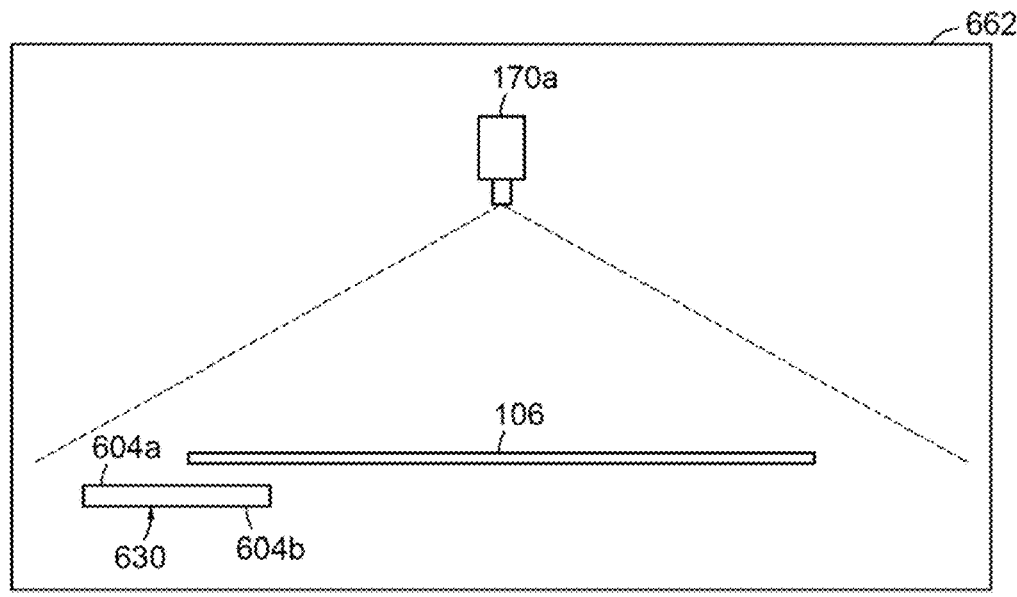
FIGS. 6A and 6B show an embodiment of the factory interface of the integrated platform of FIG. 1 configured to measure a temperature of a substrate using a known heat source.
Figure 6B:
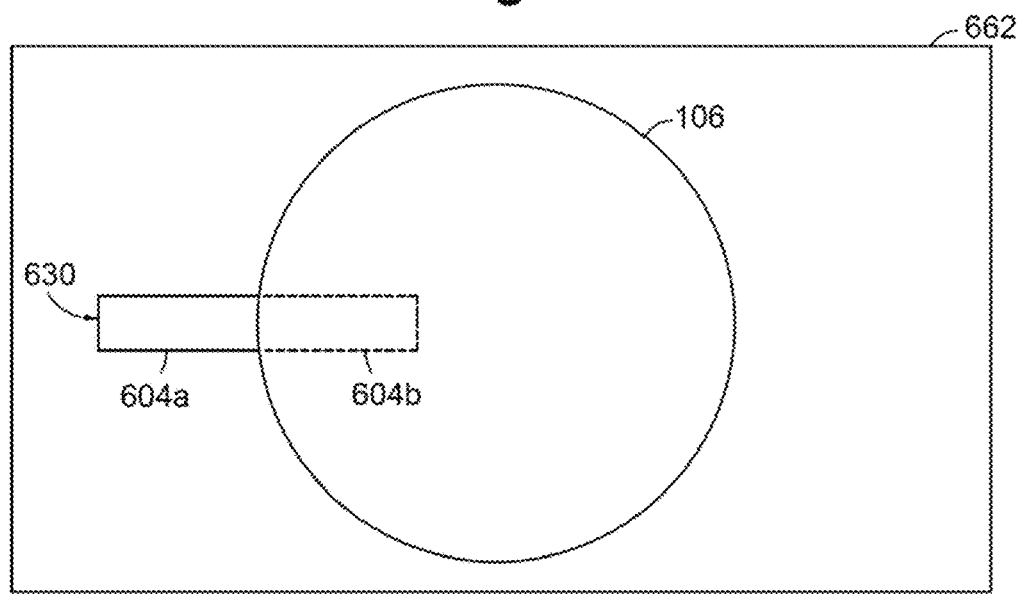

FIG. 6A-6B show an embodiment of a factory interface 662 for use in the integrated platform 100 of FIG. 1. The factory interface 662 is configured to measure a temperature of a substrate 106 while using a heating element 630. The factory interface 662 is similar to the factory interface 162 and may be used in place thereof. The factory interface 662 may also include one or more hardware components of factory interface 162, which may not be shown in FIGS. 6A-6B for clarity.

In the factory interface 662, a substrate 106 is positioned proximate to and/or astride a heating element 630. The substrate 106 is positioned between an infrared camera 170a and the heating element 630. A first portion 604a of the preheated element 630 is directly in the field of view of the infrared camera 170a (not overlapped by the substrate 106) and a second portion 604b of the preheated element 630 is overlapped by the substrate 106. The trigger 168 is configured to trigger the infrared camera 170a to obtain an image of the top surface of the substrate 106 including the first portion 604a directly viewable by the infrared camera 170a and the second portion 604b viewable by the infrared camera 170a through the substrate 106. The controller 164 is configured to process the infrared image to determine differences between a first temperature of the first portion 604a and a second temperature of the second portion 604b. The controller 164 is further configured to identify a type of the substrate 106 based on the differences. (e.g., a bare substrate, a doped substrate, a substrate with semiconductor devices manufactured thereon, etc.).

Figure 7A:
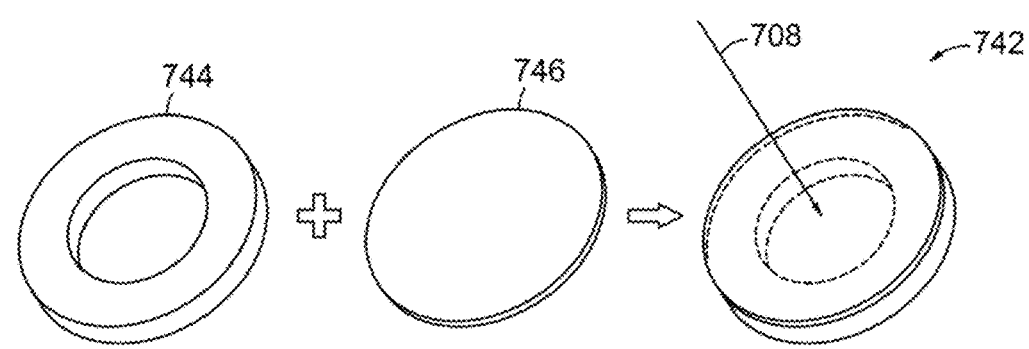
FIG. 7A illustrates a black body element for a robot end effector, according to one embodiment of the disclosure.

FIG. 7A illustrates a black body element for a robot end effector, according to one embodiment of the disclosure. FIGS. 7B and 7C illustrate the black body element coupled to a robot end effector.

FIG. 7A shows one embodiment of the parts of the reflective blackbody element 742. The blackbody element 742 comprises a blackbody membrane disc 746 and an annular membrane holder 744 coupled together in axial alignment. The annular membrane holder 744 includes a central opening formed axially therethrough and is made of polyether ether ketone (PEEK). However, other materials are also contemplated.

FIGS. 7B and 7C illustrate the blackbody element 742 coupled to a robot end effector 788. In FIG. 7B, the blackbody element 742 is centrally positioned on an upper surface of a robot end effector 788 (for example, of the factory interface robot 185) between opposing sloping surfaces 770. In FIG. 7C, the blackbody element 742 is offset on an upper surface of a robot end effector 788 between opposing sloping surfaces 770. The opposing sloping surfaces 770 are elevated at later edges of the robot end effector 788 such that when a substrate 106 is positioned thereon, the substrate 106 is spaced apart from the blackbody element 742. In such an example, the substrate 106 is positioned vertically above the blackbody element 742, such that the substrate 106 is between the blackbody element 742 and the infrared camera 170a.

During operation, the controller 164 (shown in FIG. 1) triggers the infrared camera 170a to obtain an image of the top side of the substrate 106 including the blackbody element 742 viewable by the infrared camera 170a through the substrate 106. The controller 164 is further configured to analyze the image to determine a temperature of the substrate 106 based on an amount of infrared light emitted from the blackbody element 702 and viewable through the substrate 106. Such a correlation between temperature and emitted radiation may be experimentally determined. The controller 164 may reference a look up table stored in memory 154 of the controller 164 to determine a temperature of the substrate 106.

Figure 8:
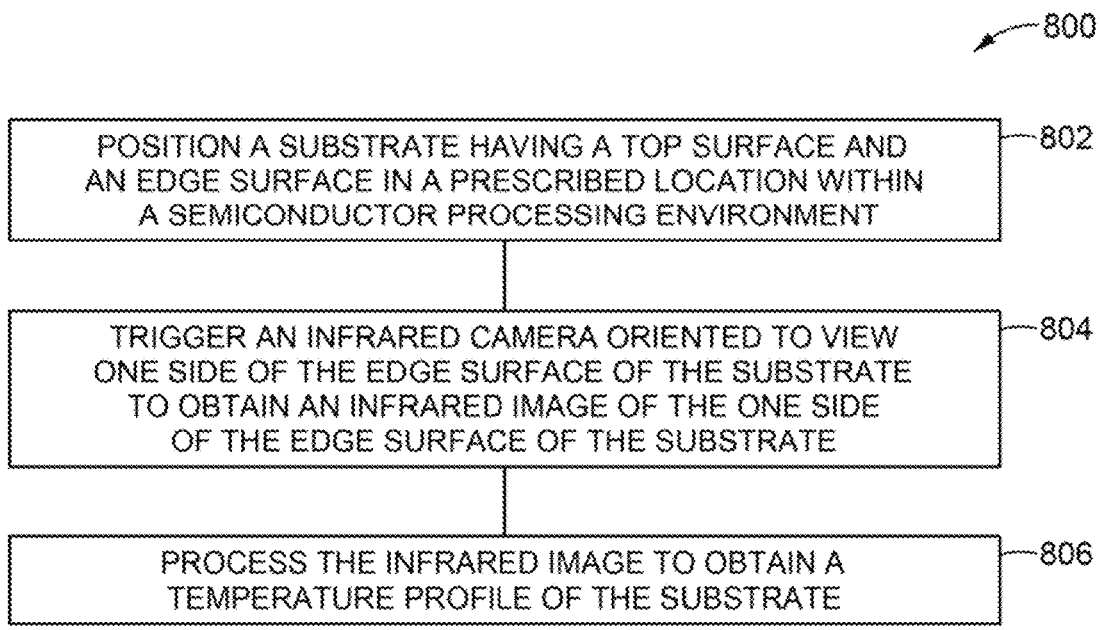
FIG. 8 illustrates a flow chart of a method for measuring a temperature of a substrate located in a factory interface of a semiconductor processing environment and corresponding to FIG. 1.

FIG. 8 illustrates a flow chart of a method 800 for measuring a temperature of a substrate 106 located a factory interface 162 of a semiconductor processing environment and corresponding to FIG. 1, according to one or more embodiments. At operation 802, a substrate 106 having a top surface and an edge surface is positioned in a prescribed location within the semiconductor processing environment. At operation 804, an infrared camera 166 having an orientation configured to view one side of the edge surface of the substrate, is triggered to obtain an infrared image of the one side of the edge surface of the substrate 106. In one example, the infrared camera 166 is coplanar with the substrate 106. At operation 806, data from the infrared image is processed to obtain a temperature profile of the substrate 106. In an embodiment, the temperature profile is an absolute temperature profile. The absolute temperature profile of the substrate 106 is independent of a type of the substrate 106 (e.g., a bare substrate, a doped substrate, a substrate with semiconductor devices manufactured thereon, etc.).

In an embodiment, the infrared camera 166 is oriented to view the edge surface of the substrate 106 along a radial axis of the substrate 106. A correlation between captured infrared intensity in an image and the temperature of a substrate may be stored in the memory 154 of a controller 164 and accessed to obtain the absolute temperature profile. The correlation may be determined experimentally, and the correlation may be stored in a memory for use.

Figure 9:
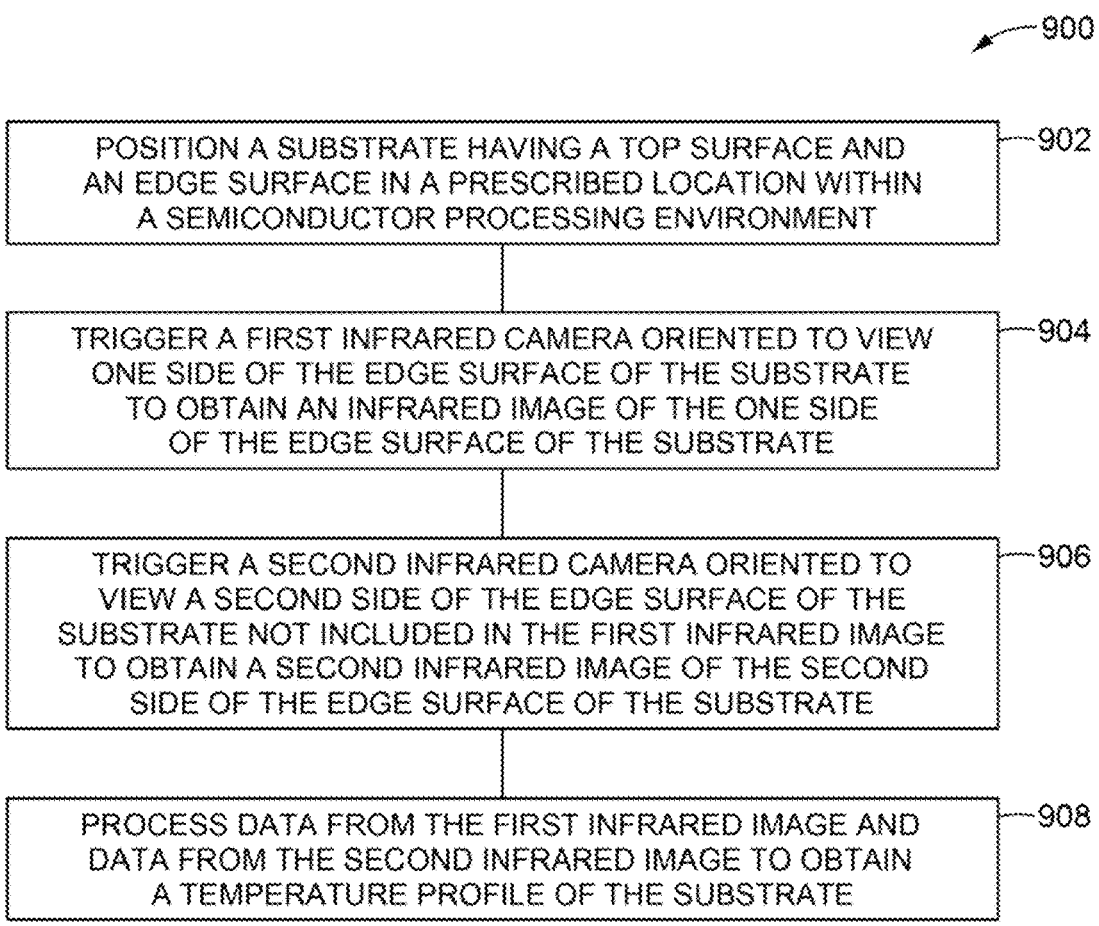
FIG. 9 illustrates a flow chart of a method for measuring a temperature of a substrate located in a factory interface of a semiconductor processing environment and corresponding to FIG. 2.

FIG. 9 illustrates a flow chart of a method 900 for measuring a temperature of a substrate 106 located in a factory interface 262 of a semiconductor processing environment and corresponding to FIG. 2, according to one or more embodiments. At operation 902, a substrate 106 having a top surface and an edge surface is positioned in a prescribed location within the semiconductor processing environment. At operation 904, a first infrared camera 166a having an orientation configured to view one side of the edge surface of the substrate 106, is triggered to obtain a first infrared image of the one side of the edge surface of the substrate 106. At operation 906, a second infrared camera 166b oriented to view a second side of the edge surface of the substrate 106 not included (or only partially included) in the first infrared image is triggered to obtain a second infrared image of the second side of the edge surface of the substrate 106. At operation 908, data from the first infrared image and data from the second infrared image are processed to obtain a temperature profile of the substrate 106. In an embodiment, the temperature profile is an absolute temperature profile. The absolute temperature profile of the substrate 106 is independent of a type of the substrate 106 (e.g., a bare substrate, a doped substrate, a substrate with semiconductor devices manufactured thereon, etc.).

Figure 10:
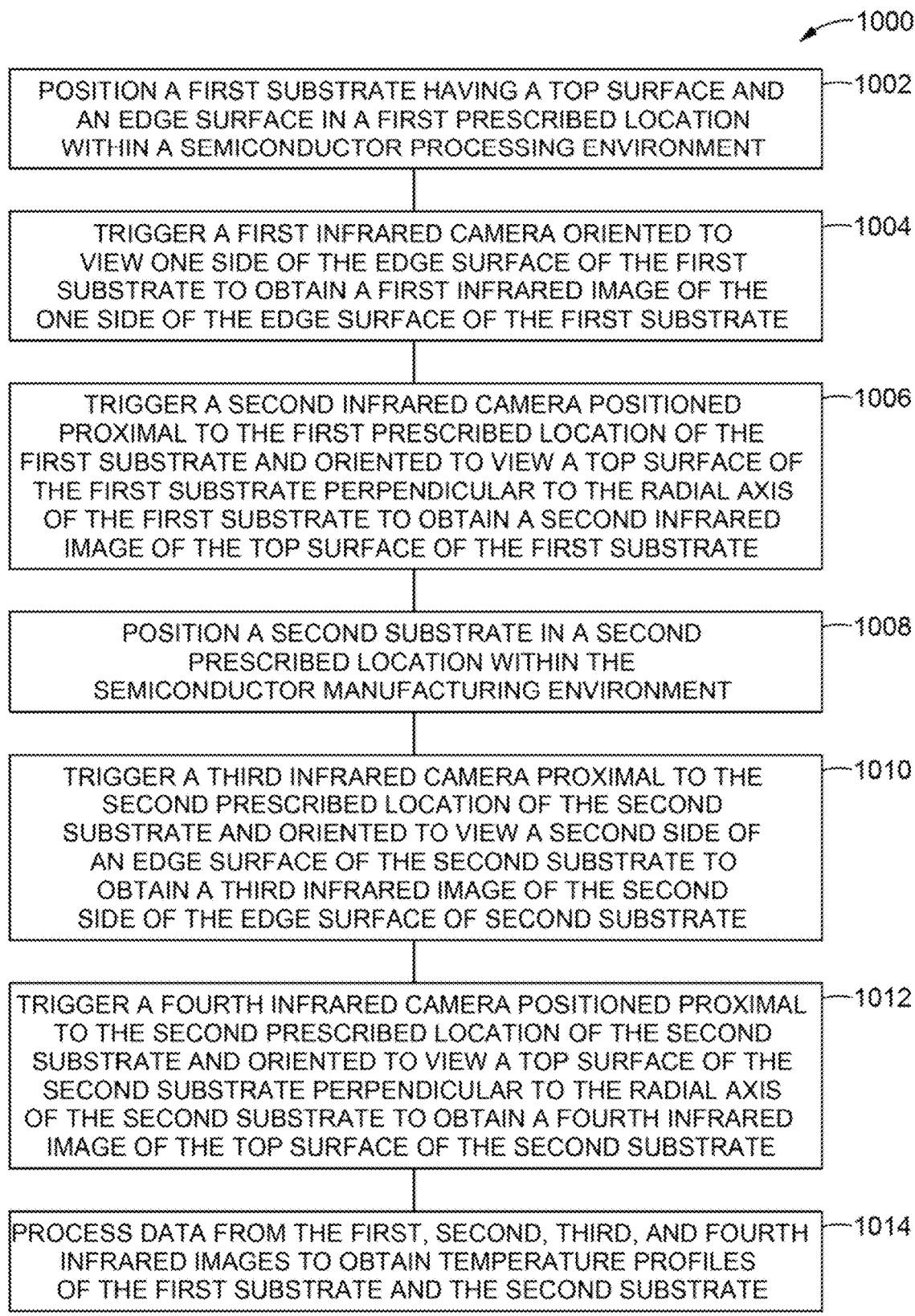
FIG. 10 illustrates a flow chart of a method for measuring a temperature of a substrate located in a factory interface of a semiconductor processing environment and corresponding to FIG. 3.

FIG. 10 illustrates a flow chart of a method 1000 for measuring temperatures of substrates 106 located in a factory interface 362 of a semiconductor processing environment and corresponding to FIG. 3, according to one or more embodiments. At operation 1002, a first substrate 106a having a top surface and an edge surface is positioned in a first prescribed location within the semiconductor processing environment. At operation 1004, a first infrared camera 166 having an orientation configured to view one side of the edge surface of the first substrate 106, is triggered to obtain a first infrared image of the one side of the edge surface of the first substrate 106. At operation 1006, a second infrared camera 170a, positioned proximal to the first prescribed location of the first substrate 106 and having an orientation configured to view a top surface of the first substrate 106 perpendicular to the radial axis of the first substrate 106, is triggered to obtain a second infrared image of the top surface of the first substrate 106. At operation 1008, a second substrate 106 is positioned in a second prescribed location within the semiconductor processing environment. At operation 1010, a third infrared camera 166b proximal to the second prescribed location of the second substrate 106b and having an orientation configured to view a second side of an edge surface of the second substrate 106, is triggered to obtain a third infrared image of the second side of the edge surface of the second substrate 106. At operation 1012, a fourth infrared camera 170b positioned proximal to the second prescribed location of the second substrate 106 and having an orientation configured to view a top surface of the second substrate 106b perpendicular to the radial axis of the second substrate 106, is triggered to obtain a fourth infrared image of the top surface of the second substrate 106. At operation 1014, data from the first, second, third, and fourth infrared images are processed to obtain a temperature profile of the first substrate 106 and a temperature profile of the second substrate 106. In an embodiment, the temperature profiles are absolute temperature profiles. The absolute temperature profiles of the substrates 106 are independent of a type of the substrates 106 (e.g., a bare substrate, a doped substrate, a substrate with semiconductor devices manufactured thereon, etc.). The obtained absolute temperature profiles may be processed further to identify one or more locations on the top of the substrates 106 that are above an oxidation temperature of the substrates 106.

Figure 11:
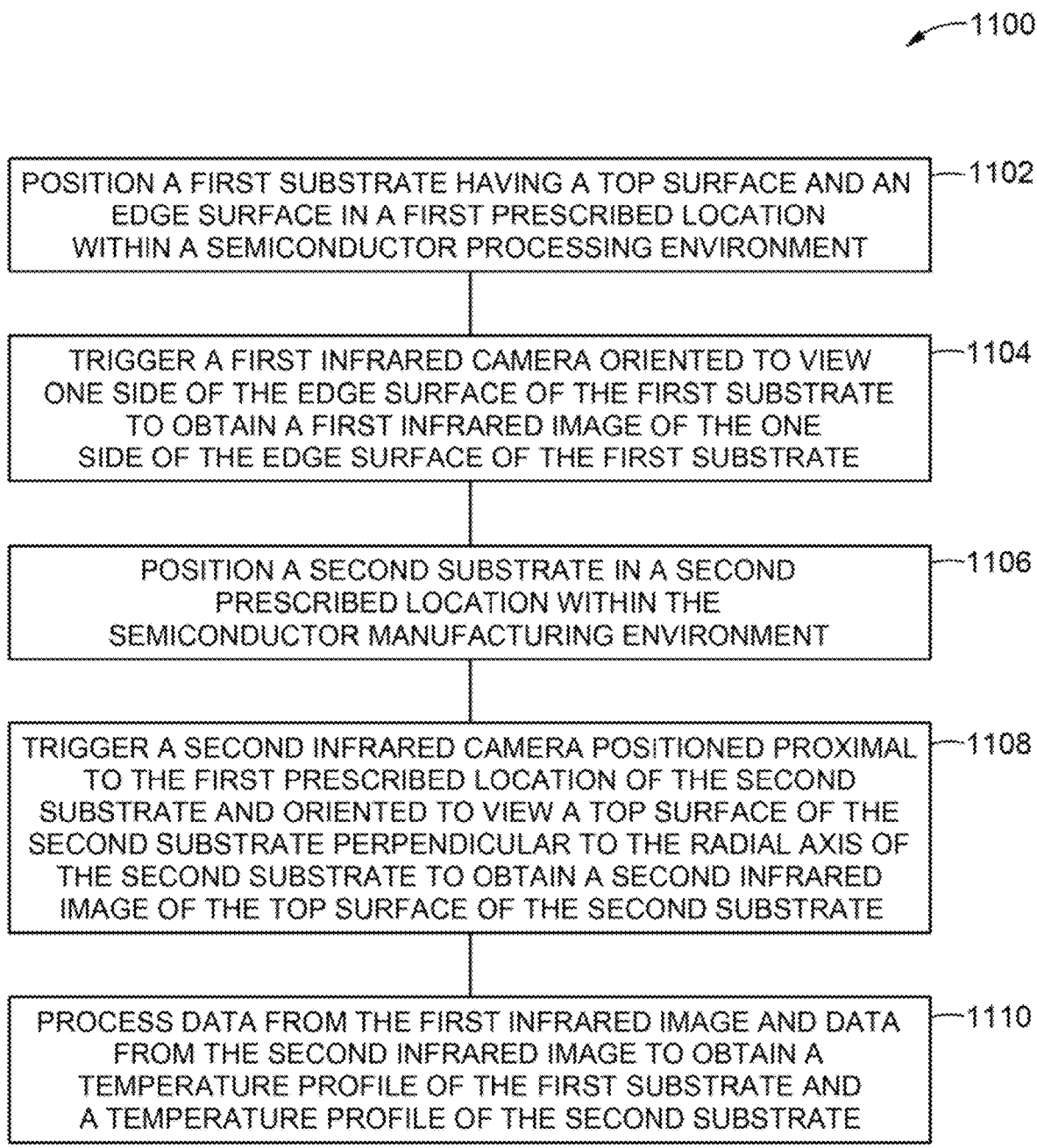
FIG. 11 illustrates a flow chart of a method for measuring a temperature of a substrate located in a factory interface of a semiconductor processing environment and corresponding to FIG. 4.

FIG. 11 illustrates a flow chart of a method 1100 for measuring a temperature of a substrate 106 located in a factory interface 462 of a semiconductor processing environment and corresponding to FIG. 4, according to one or more embodiments. At operation 1102, a first substrate 106 having a top surface and an edge surface is positioned in a first prescribed location within the semiconductor processing environment. At operation 1104, a first infrared camera 166a having an orientation configured to view one side of the edge surface of the first substrate 106, is triggered to obtain a first infrared image of the one side of the edge surface of the first substrate 106. At operation 1106, a second substrate 106 is positioned in a second prescribed location within the semiconductor processing environment. At operation 1108, a second infrared camera 166b proximal to the second prescribed location of the second substrate 106 and having an orientation to view a second side of the edge surface of the second substrate 106, is triggered to obtain a second infrared image of the second side of the edge surface of the second substrate 106b. At operation 1110, data from the first and second infrared images are processed to obtain a relative temperature profile of the first substrate 106 and a relative temperature profile of the second substrate 106. The relative temperature profiles are independent of a type of the substrate 106 (e.g., a bare substrate, a doped substrate, a substrate with semiconductor devices manufactured thereon, etc.).

Figure 12:
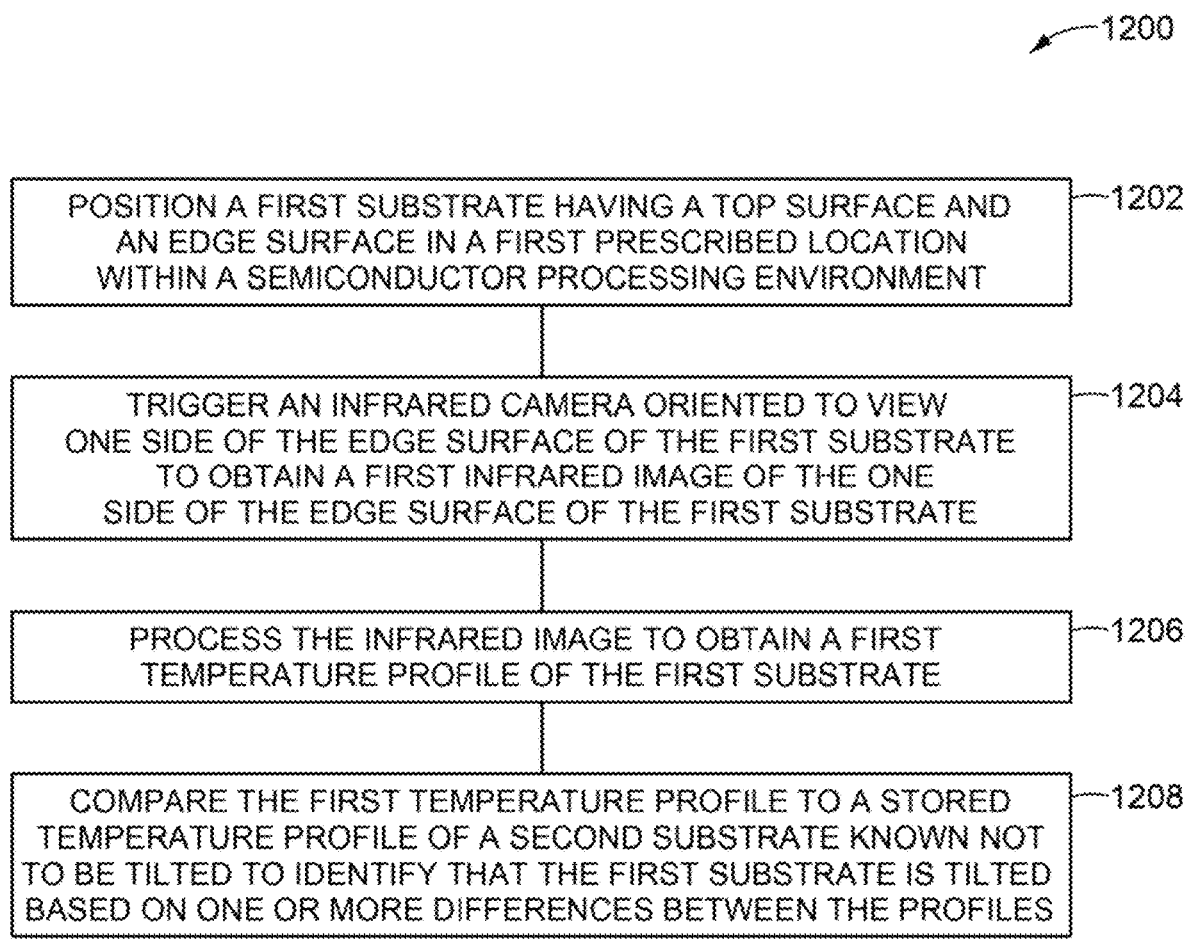
FIG. 12 illustrates a flow chart of a method for determining whether a substrate is tilted in a factory interface of a semiconductor processing environment and corresponding to FIG. 5.

FIG. 12 illustrates a flow chart of a method 1200 for determining whether a substrate is tilted in a factory interface of a semiconductor processing environment and corresponding to FIG. 5, according to one or more embodiments. At operation 1202, a substrate 106b having a top surface and an edge surface is positioned in a prescribed location within a semiconductor processing environment. At operation 1204, an infrared camera 166 having an orientation configured to view one side of the top and edge surfaces of the substrate 106b is triggered to obtain a first infrared image of the one side of the top surface and edge surface of the substrate 106b. At operation, 1206 the first infrared image is to obtain a first temperature profile of the substrate 106b. At operation 1208, the first temperature profile and a second temperature profile of a substrate 106a known to be not tilted and stored in the memory 154 are compared to identify that the first substrate 106a is tilted based on one or more differences between the profiles. In one embodiment, to identify that the first substrate 106a is tilted, the controller 164 detects a change in edge temperature and a shift of a location of high temperature at a center of the top surface of the substrate 106a to a second location on the top surface of the substrate 106b between the temperature profiles.

Figure 13:
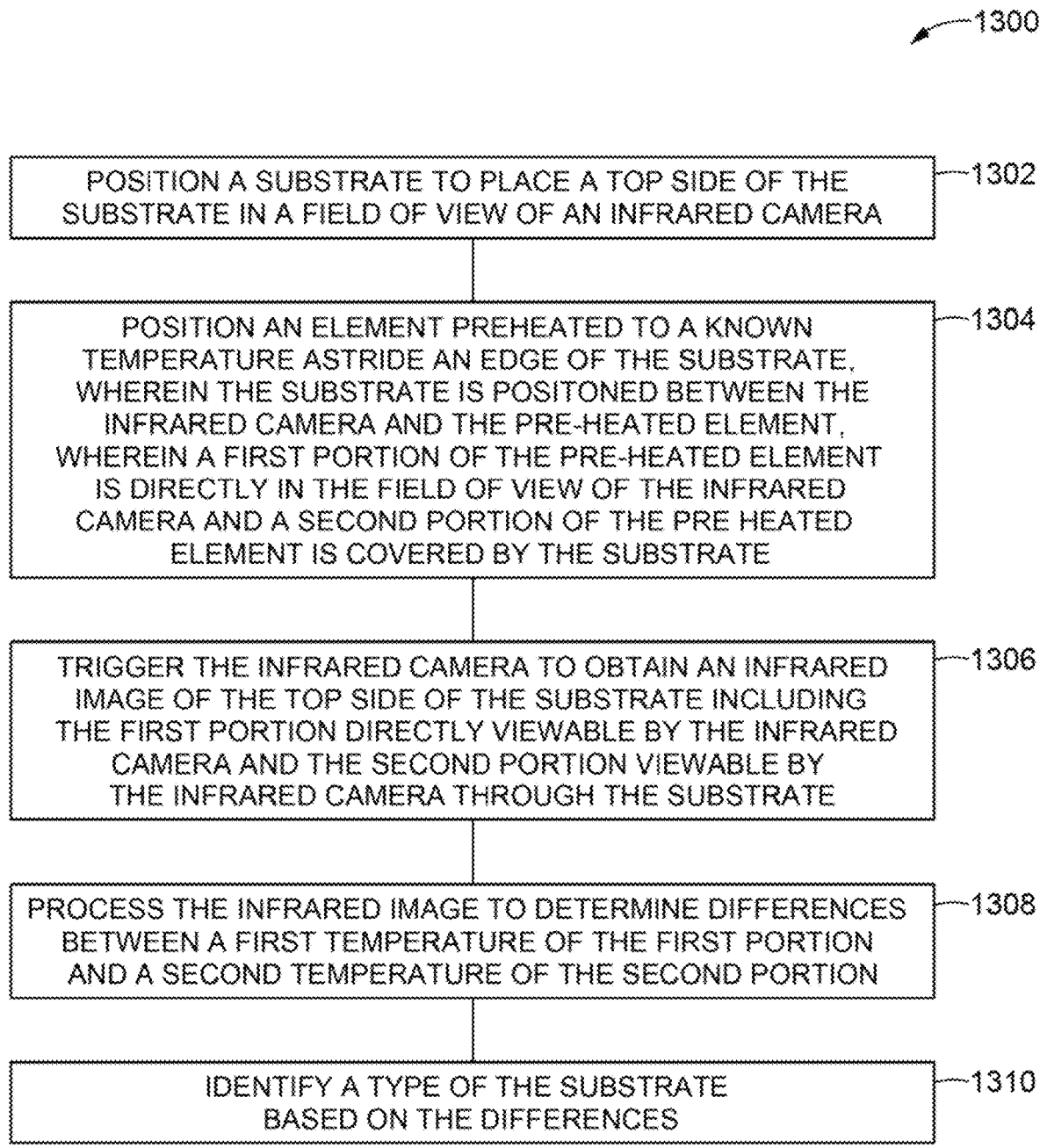
FIG. 13 illustrates a flow chart of a method for determining a type of a substrate in a semiconductor processing environment and corresponding to FIGS. 6A and 6B.

FIG. 13 illustrates a flow chart of a method 1300 for determining a type of a substrate in a semiconductor processing environment and corresponding to FIGS. 6A and 6B, according to one or more embodiments. At operation 1302, a substrate 106 is positioned to place a top surface of the substrate 106 in a field of view of an infrared camera 170a. At operation 1304, a heating element 630 at a known temperature is positioned astride an edge of the substrate 106. The substrate 106 is positioned between the infrared camera 170a and the heating element 630. A first portion 604a of the heating element 630 is directly in the field of view of the infrared camera 170a and a second portion 604b of the heating element 630 is covered by the substrate 106. At operation 1306, the infrared camera 170a is triggered to obtain an image of the top side of the substrate 106 including the first portion 604a directly viewable by the infrared camera 170a and the second portion 604b viewable by the infrared camera 170a through the substrate 106. At operation 1308, the infrared image is processed to determine differences between a first temperature of the first portion 604a and a second temperature of the second portion 604b. At operation 1310, a type of the substrate 106 is determined based on the differences. (e.g., a bare substrate, a doped substrate, a substrate with semiconductor devices manufactured thereon, etc.).

Figure 14:
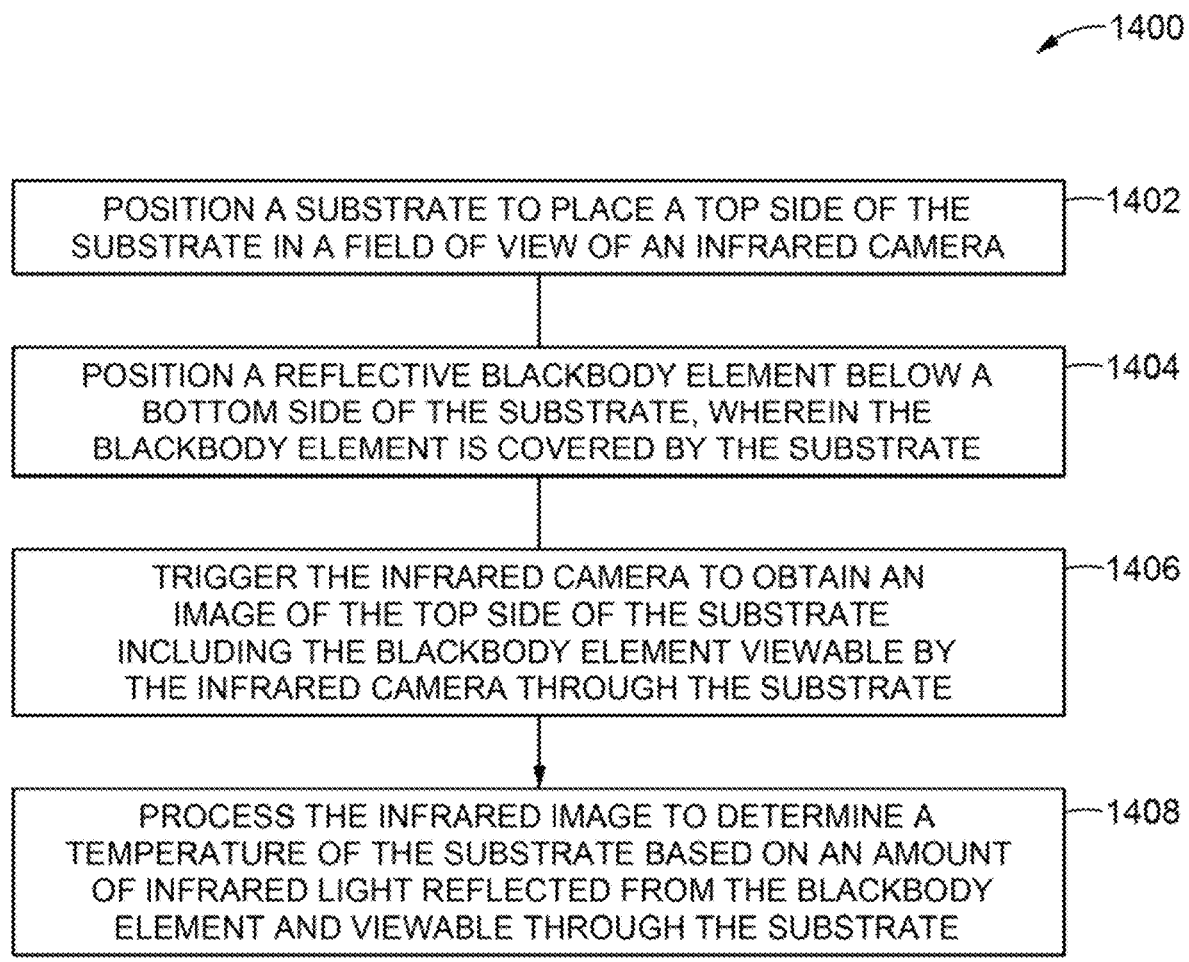
FIG. 14 illustrates a flow chart of a method for measuring a temperature of a substrate located in a factory interface of a semiconductor processing environment and corresponding to FIGS. 7A-7C.

FIG. 14 illustrates a flow chart of a method 1400 for measuring a temperature of a substrate 106 located in integrated platform 100 of a semiconductor processing environment and corresponding to FIGS. 7A-7C, according to one or more embodiments. At operation 1402, a substrate 106 is positioned to place a top surface of the substrate 106 in a field of view of an infrared camera 166. At operation 1404, a reflective blackbody element 702 is positioned below a bottom surface of the substrate 106, wherein the blackbody element 702 is covered by the substrate 106. At operation 1406, the infrared camera 166 is triggered to obtain an image of the top surface of the substrate 106 including the blackbody element 702 viewable by the infrared camera 166 through the substrate 106. At block 1408, the infrared image is processed to determine a temperature of the substrate 106 based on an amount of infrared light emitted from the blackbody element 702 and viewable through the substrate 106.

Embodiments of the present disclosure further relate to any one or more of the following paragraphs:

1. A method for identifying a type of a substrate located in a semiconductor processing environment, comprising: positioning a substrate to place a top surface of the substrate in a field of view of an infrared camera; positioning an element preheated to a known temperature next to an edge of the substrate, wherein the substrate is located between the infrared camera and the preheated element, wherein a first portion of the preheated element is directly in the field of view of the infrared camera and a second portion of the preheated element is covered by the substrate; triggering the infrared camera to obtain an infrared image of the top surface of the substrate including the first portion directly viewable by the infrared camera and the second portion viewable by the infrared camera through the substrate; processing data from the infrared image to determine a difference between a first temperature of the first portion and a second temperature of the second portion; and identifying a type of the substrate based on the difference.

2. A method for determining whether a substrate is tilted, comprising:
positioning a top surface of a first substrate in a field of view of an infrared camera; triggering the infrared camera to obtain a first infrared image of the top surface of the first substrate; processing data from the first infrared image to obtain a first temperature profile; and comparing the first temperature profile to a stored temperature profile of a second substrate known not to be tilted to identify that the first substrate is tilted based on one or more differences between the profiles.

3. A method for determining whether a substrate is tilted, comprising: positioning a top surface of a first substrate in a field of view of an infrared camera; triggering the infrared camera to obtain a first infrared image of the top surface of the first substrate; processing data from the first infrared image to obtain a first temperature profile; and comparing the first temperature profile to a stored temperature profile of a second substrate known not to be tilted to identify that the first substrate is tilted based on one or more differences between the profiles, wherein identifying the first substrate is tilted comprises: detecting a change in edge temperature between the first substrate and the second substrate above a first threshold; and detecting and a shift of a location of high temperature at a center of the top surface of the second substrate to a second location on the top surface of the second substrate above a second threshold.

While embodiments have been described herein, those skilled in the art, having benefit of this disclosure will appreciate that other embodiments are envisioned that do not depart from the inventive scope of the present application. Accordingly, the scope of the present claims or any subsequent related claims shall not be unduly limited by the description of the embodiments described herein.

What is claimed is:

1. A method for measuring a temperature of a substrate located in a semiconductor processing environment, comprising:
positioning the substrate having a top surface and a lateral edge surface in a prescribed location on a substrate support within the semiconductor processing environment;
triggering an infrared camera oriented to view one side of the lateral edge surface of the substrate to obtain an infrared image of the one side of the lateral edge surface of the substrate while the substrate is positioned in the prescribed location; and
processing data from the infrared image to obtain a temperature profile of the substrate, wherein the infrared camera is oriented to view the lateral edge surface of the substrate along a radial axis of the substrate.

2. The method of claim 1, wherein the infrared camera is coplanar with the substrate.

3. The method of claim 1, wherein the infrared camera is a first infrared camera, the infrared image is a first infrared image, and the method further comprises:
triggering a second infrared camera oriented to view a second side of the lateral edge surface of the substrate not included in the first infrared image to obtain a second infrared image of the second side of the lateral edge surface of the substrate.

4. The method of claim 3, wherein processing data from the infrared image comprises processing data from the first infrared image and data from the second infrared image to obtain the temperature profile of the substrate.

5. The method of claim 1, wherein the infrared camera is a first infrared camera, the infrared image is a first infrared image, wherein the substrate is a first substrate, a second infrared camera is located proximal to a second prescribed location of a second substrate, and the method further comprises:
triggering the second infrared camera oriented to view a side of a lateral edge surface of the second substrate to obtain a second infrared image of the side of the lateral edge surface of the second substrate,
wherein processing data from the infrared image comprises processing data from the first infrared image to obtain a first temperature profile of the first substrate and processing data from the second infrared image to obtain a second temperature profile of the second substrate.

6. The method of claim 1, wherein the infrared camera is a first infrared camera, the infrared image is a first infrared image, the prescribed location is a first prescribed location, the substrate is a first substrate, and the method further comprises:
triggering a second infrared camera positioned proximal to the first prescribed location of the first substrate and oriented to view the top surface of the first substrate perpendicular to a radial axis of the first substrate to obtain a second infrared image of the top surface of the first substrate;
positioning a second substrate in a second prescribed location within the semiconductor processing environment;
triggering a third infrared camera proximal to the second prescribed location of the second substrate and oriented to view a side of a lateral edge surface of the second substrate to obtain a third infrared image of the side of the lateral edge surface of the second substrate; and
triggering a fourth infrared camera positioned proximal to the second prescribed location of the second substrate and oriented to view the top surface of the second substrate perpendicular to the radial axis of the second substrate to obtain a fourth infrared image of the top surface of the second substrate,
wherein processing data from the infrared image comprises processing data from the first, second, third, and fourth infrared images to obtain temperature profiles of the first substrate and the second substrate.

7. The method of claim 6, further comprising: second processing of the data to identify one or more locations on the top surface of the first substrate and/or the second substrate that are above an oxidation temperature of the first substrate and/or the second substrate.

8. The method of claim 6, wherein a reflective blackbody element is positioned below a bottom surface of the first substrate.

9. The method of claim 8, wherein processing data from the infrared image comprises processing data from the infrared image to determine a temperature of the first substrate based on an amount of infrared light reflected from the reflective blackbody element and viewable through the first substrate.

10. The method of claim 8, wherein the reflective blackbody element comprises a blackbody membrane disc and an annular membrane holder.

11. The method of claim 10, wherein infrared light reflected from the reflective blackbody element and viewable through the first substrate is from an exposed portion of the blackbody membrane disc unobscured by the annular membrane holder.

12. A factory interface configured to measure a temperature of a substrate, comprising:
a body;
a factory interface robot disposed in the body and having an end effector for transferring the substrate between one or more load lock chambers and the factory interface, the factory interface robot configured to position the substrate in a prescribed location on a substrate support of the factory interface; and
an infrared camera positioned in the factory interface and radially aligned with the prescribed location; and
a controller configured to:
trigger the infrared camera oriented to view one side of a lateral edge surface of the substrate to obtain a first infrared image of the substrate while the substrate is positioned in the prescribed location, wherein the infrared camera is oriented to view the lateral edge surface of the substrate along a radial axis of the substrate; and
processing data from the first infrared image to obtain an absolute temperature profile of the substrate.

13. The factory interface of claim 12, further comprising: a trigger configured to trigger the infrared camera in response to the substrate entering the factory interface.

14. The factory interface of claim 12, wherein the controller is configured to trigger the infrared camera in response to a signal from a proximity sensor.

15. The factory interface of claim 12, wherein the factory interface robot is centrally located within the factory interface.

16. The factory interface of claim 12, wherein the infrared camera is a first infrared camera and wherein the controller is further configured to:
trigger a second infrared camera oriented to view a second side of the lateral edge surface of the substrate not included in the first infrared image to obtain a second infrared image of the second side of the lateral edge surface of the substrate,
wherein obtaining an absolute temperature profile of the substrate comprises processing data from the first infrared image and processing data from the second infrared image.

17. A factory interface configured to measure a temperature of a substrate, comprising:
a body;
a factory interface robot disposed in the body, the factory interface robot having an end effector for transferring the substrate through the factory interface, the factory interface robot configured to position the substrate in a prescribed location on a substrate support of the factory interface, the factory interface robot configured to:
position the substrate in the prescribed location on the substrate support of the factory interface to place a lateral edge surface of the substrate in a field of view of a first infrared camera positioned proximal to an edge of the substrate and radially aligned with the substrate to view the lateral edge surface of the substrate along a radial axis of the substrate, and a top surface of the substrate in a field of view of a second infrared camera positioned to view the substrate perpendicular to the radial axis of the substrate; and
position a reflective blackbody element below a bottom surface of the substrate, wherein the reflective blackbody element is covered by the substrate; and
a controller configured to:
trigger the first infrared camera to view one side of the lateral edge surface of the substrate to obtain a first image of the one side of the lateral edge surface of the substrate while the substrate is positioned in the prescribed location;
trigger the second infrared camera to obtain a second image of the top surface of the substrate including the reflective blackbody element viewable by the second infrared camera through the substrate; and
analyze the first image to determine a temperature of the substrate based on an amount of infrared light reflected from the reflective blackbody element and viewable through the substrate.

18. The factory interface of claim 17, wherein the reflective blackbody element comprises a blackbody membrane disc and an annular membrane holder.

19. The factory interface of claim 18, wherein the infrared light reflected from the reflective blackbody element and viewable through the substrate is from an exposed portion of the blackbody membrane disc unobscured by the annular membrane holder.

20. The factory interface of claim 17, wherein the prescribed location is vertically spaced from the reflective blackbody element.

* * * * *